(12) United States Patent
Niu et al.

(10) Patent No.: US 12,047,094 B2
(45) Date of Patent: Jul. 23, 2024

(54) DECODING METHOD AND DECODING DEVICE

(71) Applicant: Beijing University of Posts and Telecommunications, Beijing (CN)

(72) Inventors: Kai Niu, Beijing (CN); Yuxin Han, Beijing (CN); Xuanyu Li, Beijing (CN)

(73) Assignee: Beijing University of Posts and Telecommunications, Beijing (CN)

( * ) Notice: Subject to any disclaimer, the term of this patent is extended or adjusted under 35 U.S.C. 154(b) by 1 day.

(21) Appl. No.: 18/298,615

(22) Filed: Apr. 11, 2023

(65) Prior Publication Data

US 2024/0097706 A1   Mar. 21, 2024

(30) Foreign Application Priority Data

Sep. 16, 2022  (CN) .......................... 202211131855.9

(51) Int. Cl.
*H03M 13/00* (2006.01)
*H03M 13/11* (2006.01)
(52) U.S. Cl.
CPC .... *H03M 13/1108* (2013.01); *H03M 13/1148* (2013.01)

(58) Field of Classification Search
CPC .................. H03M 13/1108; H03M 13/1148
See application file for complete search history.

(56) References Cited

U.S. PATENT DOCUMENTS

| | | | | |
|---|---|---|---|---|
| 2012/0185755 A1* | 7/2012 | Orlik | .................. | H03M 13/136 |
| | | | | 714/781 |
| 2012/0263080 A1* | 10/2012 | Cho | .................... | H04B 7/0617 |
| | | | | 370/310 |
| 2022/0216886 A1* | 7/2022 | Choi | .................... | H03M 13/451 |

* cited by examiner

*Primary Examiner* — Christine T. Tu
(74) *Attorney, Agent, or Firm* — Westbridge IP LLC

(57) ABSTRACT

Disclosed are a decoding method and a decoding device. In the method, a received sequence and a generator matrix are processed to obtain a hard-decision information sequence and a hard-decision codeword; an error pattern is determined according to the hard-decision information sequence and the hard-decision codeword; then, the error pattern is post-processed and an optimal decoding sequence is output as a decoding result, wherein the optimal decoding sequence is a decoding sequence with a minimized Euclidean distance. According to the present disclosure, the complexity of the algorithm is reduced while the effective decoding performance can be ensured.

20 Claims, 5 Drawing Sheets

DECODING METHOD AND DECODING DEVICE

CROSS-REFERENCE TO RELATED APPLICATIONS

This application claims priority to Chinese Patent Application No. 202211131855.9, filed on Sep. 16, 2022, the content of which is incorporated herein by reference in its entirety.

TECHNICAL FIELD

The present disclosure relates to communication technologies, and in particular to a decoding method and a decoding device.

BACKGROUND

The 3rd generation partnership project (3GPP) has defined ultra-reliable low-latency communications (URLLC) as critical communication scenarios of 5th generation mobile communication technology (5G) networks, 6th generation mobile communication technology (6G) networks or above. URLLC not only requires a decoding algorithm with a high performance, that is, close to the performance of maximum likelihood (ML) decoding, but also requires a decoding algorithm with a low complexity. An existing ordered statistic decoding (OSD) algorithm can obtain maximum likelihood decoding performance, but the complexity of which is high.

SUMMARY

In view of the above, the present disclosure provides a decoding method, which includes the following steps: processing a received sequence and a generator matrix to obtain a hard-decision information sequence and a hard-decision codeword; obtaining an error pattern according to the hard-decision information sequence and the hard-decision codeword; and post-processing the error pattern and outputting an optimal decoding sequence as a decoding result; wherein the optimal decoding sequence is a decoding sequence with a minimum Euclidean distance.

Based on the decoding method, the present disclosure also provides a decoding device, which includes: a memory, a processor, and a computer program stored in the memory and executable on the processor, wherein the processor executes the computer program to implement the decoding method.

Moreover, the present disclosure also provides a non-transitory computer-readable storage medium, wherein the non-transitory computer-readable storage medium stores computer instructions, and the computer instructions being used to make a computer execute the decoding method.

As can be seen from the above, in the decoding method, a received sequence and a generator matrix are preprocessed to obtain an information sequence and a codeword at first. Then, an error pattern is obtained from the information sequence and the codeword. Finally, the error pattern is post-processed, and an optimal decoding sequence is output as a decoding result. According to the present disclosure, a complexity of the algorithm is reduced while an effective decoding performance is ensured. In addition, a maximum number of iteration times is set to prevent blind queries, thereby the number of query times in the decoding process can be greatly reduced and the complexity of decoding can be greatly reduced as well.

BRIEF DESCRIPTION OF THE DRAWINGS

In order to describe the technical solutions in one or more examples of the present disclosure or the prior art more clearly, the following briefly introduces accompanying drawings for describing the examples or the prior art. Apparently, the accompanying drawings in the following description show only the examples of the present disclosure, and those of ordinary skill in the art may still derive other drawings from these drawings without any creative efforts.

DETAILED DESCRIPTION OF THE EMBODIMENTS

Figure 1:
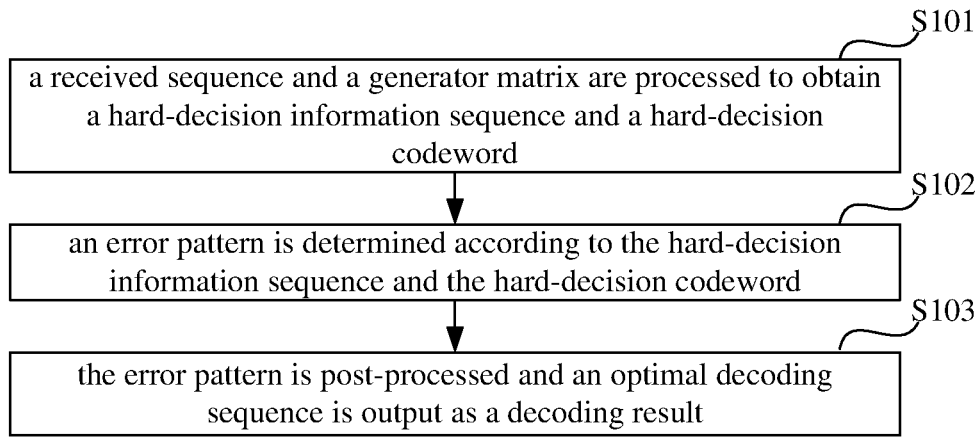
FIG. 1 is a flowchart of a decoding method according to examples of the present disclosure.

To make the objectives, technical solutions and advantages of the present disclosure clearer, the present disclosure will be further described in detail below in conjunction with specific examples and with reference to the accompanying drawings.

It should be noted that, unless otherwise defined, technical terms or scientific terms used in one or more examples of the specification should have the ordinary meanings as understood by those of ordinary skill in the art to which the present disclosure belongs. The terms "first", "second" and similar words used in one or more examples of the specification do not denote any order, quantity, or importance, but are merely used to distinguish different components. The terms "including" or "comprising" and the like are intended to indicate that elements or objects in front of the word encompass elements or objects listed after the word and their equivalents, but do not exclude another element or object. Similar terms such as "connected" or "linked" are not limited to physical or mechanical connections, but may include electrical connections, whether direct or indirect. The terms "upper", "lower", "left", "right" and the like are only used to represent a relative positional relationship, and when an absolute position of a described object changes, the relative positional relationship may also change accordingly.

Generally, coding close to Shannon boundary lacks effective decoding algorithms. That using a successive cancellation list (SCL) decoding algorithm to decode cyclic redundancy check (CRC) concatenated polar codes may get a performance close to ML decoding performance. However, a larger list size may be required, resulting in a high calculation complexity. To achieve an ML decoding performance while maintaining the decoding complexity as low as possible, a new decoding algorithm and an efficient implementation thereof are required. In the prior art, OSD and guessing random additive noise decoding (GRAND) are proposed to serve as a candidate universal decoder of URLLC. OSD and GRAND can decode any linear block code.

The URLLC coding scheme requires to meet strict latency and reliability requirements. Therefore, a short code with a strong error correction ability is very important. However, using a block code with a small code length may reduce the reliability of communications. When the code rate is the same, compared with a long codeword, the performance of the block error rate of a short codeword is usually worse. Therefore, the design of the URLLC coding scheme requires balance between the length of the block code and the reliability of communications.

OSD is a decoding method performing soft decision on a binary linear block code. OSD can be divided into two steps. Firstly, a hard-decision decoding is performed based on a reliability measure, and then a decoding codeword obtained by the hard decision is post-processed until an ML decoding performance is achieved. For codewords with a length less than 64, the complexity of OSD is low. Therefore, OSD is suitable for decoding codewords with a short length. Moreover, the complexity of OSD will increase as the code rate increases.

GRAND decoding algorithm has numerous advantages. Firstly, GRAND decoding is a kind of ML decoding, which can achieve the best decoding performance. In addition, compared with traditional methods, the solution has an ideal characteristic of becoming more efficient with the increase of the codebook rate. Through calculation, it is found that the solution can balance the relation between the complexity and the code error rate well. Therefore, GRAND is suitable for decoding codewords with a high code rate. However, when the code rate is low, the performance and complexity of GRAND will have a certain loss.

For the above problems, the present disclosure provides a decoding algorithm capable of meeting the requirements of URLLC. The main idea of the decoding algorithm is to guess error patterns for information sequences and codewords respectively, which can be called as a joint guessing error pattern decoding (JGEPD) algorithm of information sequences and codewords. Compared with OSD and GRAND, JGEPD has the advantages of improving the performance of decoding and reducing the decoding complexity as well.

The technical solution of the present disclosure is described in detail below with reference to the accompanying drawings.

FIG. 1 is a flowchart of a decoding method according to examples of the present disclosure. As shown in FIG. 1, the decoding method may include the following steps.

In step S101, a received sequence and a generator matrix are processed to obtain a hard-decision information sequence and a hard-decision codeword.

In some examples, it is necessary to perform an initialization before the processing on the received sequence and the generator matrix. The initialization may include setting a maximum number of iteration times b (that is, the maximum query times), and setting a current number of iteration times performed (that is, the number of current query times) as Query_times. By setting the maximum number of iteration times, when the current number of iteration times of a JGEPD decoding algorithm reaches the maximum number of iteration times, the JGEPD decoding would be ended. In this case, a blind query can be prevented. Moreover, a total number of query times in the decoding process can be reduced, therefore, the complexity of the decoding process can be effectively reduced.

Figure 2:
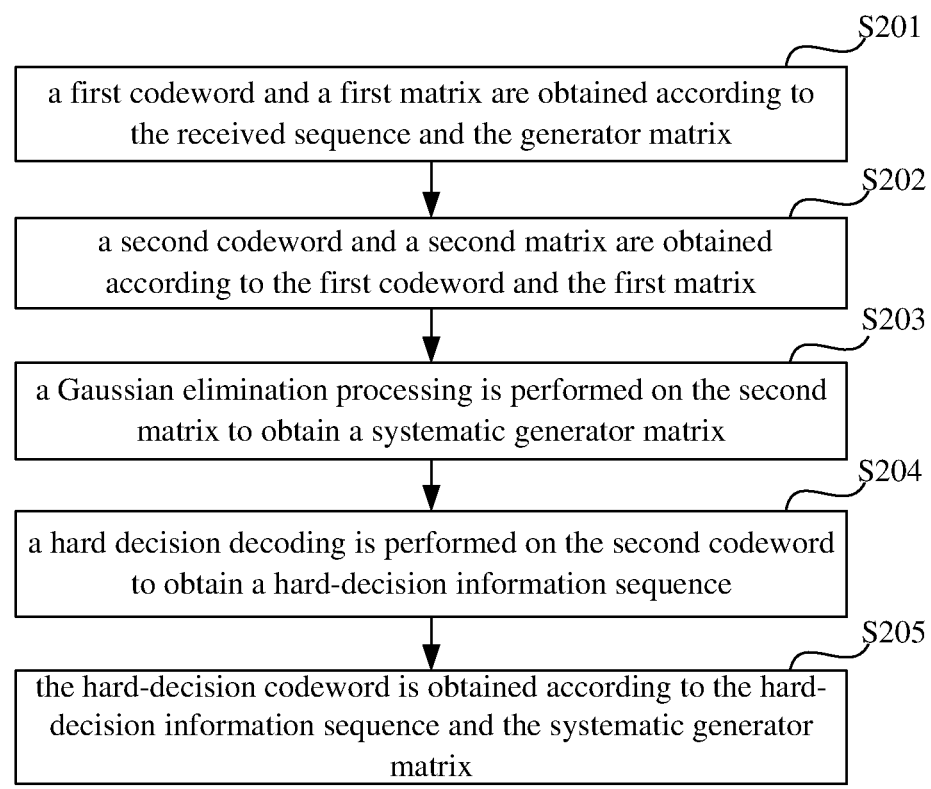
FIG. 2 is a flowchart of processing a received sequence and a generator matrix to obtain a hard-decision information sequence and a hard-decision codeword according to examples of the present disclosure.

As you may know, at a transmitter of a communication system, an information sequence $u_1^K$ is encoded into a codeword $x_1^N = u_1^K G$ by a generator matrix G. Then, the codeword $x_1^N$ is transmitted through a channel. Moreover, a received sequence $y_1^N$ is received by a receiver of the communication system from the channel. At the receiver, some transformations are performed on the received sequence $y_1^N$ and the generator matrix G to obtain a second codeword $v_1^N$ and a systematic generator matrix $G_1$. A detailed process of the transformations is shown in FIG. 2. That is, FIG. 2 is a flowchart of processing a received sequence and a generator matrix to obtain a hard-decision information sequence and a hard-decision codeword according to examples of the present disclosure. As shown in FIG. 2, the processing on the received sequence and the generator matrix may include the following steps.

In step S201, a first codeword and a first matrix are obtained according to the received sequence and the generator matrix.

Specifically, step S201 may include the following steps. At first, a first permutation processing may be performed on the receiving sequence according to a reliability of each bit of the receiving sequence to obtain a first codeword. Then, the first permutation function is used to record the process of the first permutation. Further, the first permutation processing may be performed on the generator matrix according to the first permutation function to obtain a first matrix.

For example, assuming that the received sequence is $y_1^N$, the generator matrix is G, the first permutation function is $\lambda_1$, then the first codeword can be represent as $r_1^N = \lambda_1(y_1^N)$, and the first matrix can be represented as $G' = \lambda_1(G)$. This permutation process can be called as the first permutation processing.

Specifically, at first, bits in the receiving sequence $y_1^N$ are ranked from high to low according to their reliabilities. That is, in the first permutation processing, a bit with a bit index i in the receiving sequence $y_1^N$ can be transformed to a position with a bit index $j_{1_i}$. Therefore, in the first codeword $r_1^N$, $|r_1| \geq |r_2| \geq \ldots \geq |r_N|$, wherein $|r_i|$ refers to the reliability of the bit $r_i$. Wherein, N refers to the length of a codeword, that is, the length of the codeword sent by the transmitter of the communication system. In the present disclosure, this transformation can be denoted as the first permutation function $\lambda_1$.

Further, the first permutation processing is also performed on the generator matrix G according to the first permutation function $\lambda_1$ to obtain a first matrix $G' = \lambda_1(G)$. During the first permutation processing, the $i^{th}$ column in the generator matrix G is transformed into a $j_{1i}^{th}$ column in the first matrix G'. In the first matrix, from a left to right order, the column vectors are ranked from high to low on reliability.

In step S202, a second codeword and a second matrix are obtained according to the first codeword and the first matrix.

Specifically, step S202 may include the following steps. At first, a second permutation processing is performed on the first matrix to obtain the second matrix. Then, the second permutation function is used to record the process of the second permutation. Further, the second permutation processing is performed on the first codeword using the second permutation function to obtain the second codeword.

For example, assuming that the second permutation function is $\lambda_2$, then the second matrix can be represented as $G''=\lambda_2(G')$, and the second codeword can be represent as $v_1^N=\lambda_2(r_1^N)$. This process can be called as the second permutation processing.

Specifically, in the second permutation processing, K independent and irrelevant column vectors are searched from a first column on the left of the first matrix. These K independent column vectors are used as the first K columns of the second matrix G''. The remaining N−K columns are sequentially arranged in an order from left to right and are used as the remaining N−K column vectors of the second matrix G''. Wherein, K refers to the length of information bits or the information sequence. During the second permutation processing, the $j_{1i}^{th}$ column in the first matrix G' is transformed into the $j_{2i}^{th}$ column in the second column G'', and this transformation is denoted as the second permutation function $\lambda_2$.

Further, the second permutation processing is also performed on the first codeword $r_1^N$ according to the second permutation function $\lambda_2$. During the second permutation processing, a bit with a bit index $j_{1i}$ in the first codeword $r_1^N$ can be transformed to a position with a bit index $j_{2i}$ to generate the second codeword $v_1^N$. Therefore, in the second codeword $v_1^N$, $|v_1||v_2| \geq \ldots \geq |v_K|$ and $|v_{K+1}| \geq |v_{K+2}| \geq \ldots \geq |v_N|$.

In step S203, a Gaussian elimination processing is performed on the second matrix to obtain a systematic generator matrix.

In some examples, the systematic generator $G_1$ can be obtained by performing a Gaussian elimination processing on the second matrix G''. The specific process of the Gaussian elimination processing is described as follows.

Specifically, according to some examples of the present disclosure, an elementary row transformation is performed on the intermediate generator matrix G'' to performing the Gaussian elimination processing. Then, the first K column vectors of the second matrix G'' are transformed into an identity matrix (or a unit matrix). Thus, the systematic generator matrix $G_1$ after the Gaussian elimination processing can be obtained. In this example, the systematic generator matrix $G_1$ can be represented as $G_1=[I_K P]$. Wherein, $I_K$ denotes an identity matrix; and P denotes a parity matrix.

In step S204, a hard decision decoding is performed on the second codeword to obtain a hard-decision information sequence.

In some examples, the hard-decision information sequence can be denoted as $a_1^K$. Specifically, the hard-decision decoding is performed on the first K bits of the second codeword $v_1^N$ to obtain the hard-decision information sequence $a_1^K$. It can be seen that the first K bits in the second codeword $v_1^N$ can be referred to as K independent bits with highest reliabilities.

In step S205, the hard-decision codeword is obtained according to the hard-decision information sequence and the systematic generator matrix.

Specifically, in some examples of the present disclosure, in the above step S205, the hard-decision information sequence $a_1^K$ would be re-encoded by the systematic generator matrix $G_1$ to obtain the hard-decision codeword $a_1^N=a_1^K G_1$.

In this way, the processing process on the received sequence and the generator matrix completes.

In some examples, by means of statistical analysis, the hard-decision information sequence $a_1^K$ only includes few error bits, which may reduce the number of codewords to be tested compared with other decoding algorithms. Moreover, discarding the remaining N−K bits in the hard-decision codeword may not influence the decoding performance significantly.

In step S102, an error pattern is determined according to the hard-decision information sequence and the hard-decision codeword.

In examples of the present disclosure, the bit that is most likely to be an error would be found based on an error pattern determined according to the hard-decision information sequence and the hard-decision codeword.

Moreover, the error pattern may be obtained by calculating Euclidean distances between sequences. In this way, the decoding algorithm can be performed in order. Further, a correct codeword can be found in advance based on the error pattern obtained according to the hard-decision information sequence and the hard-decision codeword. Therefore, the decoding complexity can be reduced and the decoding performance can be ensured as well.

The error pattern can be determined in different ways. In some examples of the present disclosure, the error pattern can be determined through a first guessing mode, a second guessing mode or a third guessing mode. To be noted, users can select a guessing mode to be used to determine the error pattern.

Specifically, to determine the error pattern, a first set S1 and a second set S2 should be defined in advance. Wherein, the first set S1 is used to store one or more information bit error patterns, and the second set S2 is used to store one or more codeword error patterns. To be noted, the first set S1 may store L1 error patterns at most, and the second set S2 may store L2 error patterns at most. In examples of the present disclosure, the information bit error pattern is denoted as $e_1=e\_inf_1^K$, and the codeword error pattern is denoted as $e_2=e\_code_1^N$.

Figure 3:
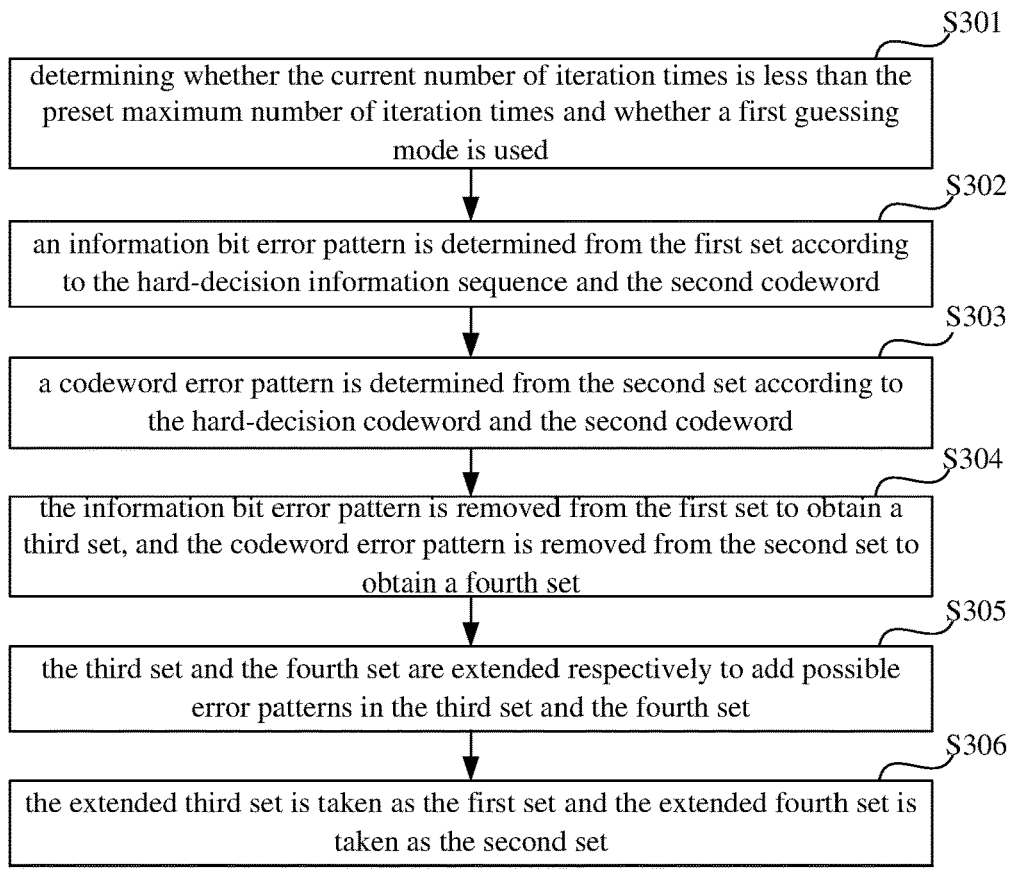
FIG. 3 is a flowchart of determining an error pattern through a first guessing mode according to some examples of the present disclosure.

FIG. 3 is a flowchart of determining an error pattern through a first guessing mode according to some examples of the present disclosure.

In step S301, determining whether the current number of iteration times is less than the preset maximum number of iteration times and whether a first guessing mode is used.

In some examples of the present disclosure, the first set S1, the second set S2, the maximum storage quantity L1 of the first set S1 and the maximum storage quantity L2 of the second set S2 would be initialized at first. Specifically, the maximum storage quantity L1 of the first set S1 can be set as 1, the maximum storage quantity L2 of the second set S2 can be set as 1 too, and the error patterns in the first set S1 and the second set S2 can be both initialized as all-zero sequences.

In the above step S301, it is determined whether the current number of iteration times Query_times is less than the preset maximum number of iteration times b, and whether the first guessing mode is used at the same time. In response to determining that the current number of iteration times is less than the preset maximum number of iteration times and the first guessing mode is used, proceed to block S302. Moreover, in response to determining that the current number of iteration times is larger than or equals to the preset maximum number of iteration times, the decoding process would be terminated.

In step S302, an information bit error pattern is determined from the first set according to the hard-decision information sequence and the second codeword.

In some examples of the present disclosure, the information bit error pattern can be determined by the following steps: for each error pattern in the first set S1, flipping the hard-decision information sequence $a_1^K$ based on the error pattern to obtain a first flipped decoding sequence; calculating a Euclidean distance between the first flipped decoding sequence and the first K bits $v_1^K$ of the second codeword $v_1^N$; and determining an error pattern $e_1$ with a minimum Euclidean distance as the information bit error pattern.

This example provides a method for selecting an information bit error pattern from the first set S1. Specifically, for an error pattern $e_1^K$ in the first set S1, the hard-decision information sequence $a_1^K$ is first flipped based on the error pattern $e_1^K$ to obtain the first flipped decoding sequence $a_1^K \oplus e_1^K$. Then a Euclidean distance between the first flipped decoding sequence and the first K bits $v_1^K$ of the second codeword $v_1^K$ is calculated. The Euclidean distance can be represented as $\|v_1^K - (1_k - 2(a_1^K \oplus e_1^K))\|^2$, wherein, $1_k$ refers to that K bits of the sequence are all 1, and 2 represents a demodulation manner being binary phase shift keying (BPSK). After the Euclidean distances corresponding to all error patterns are calculated respectively, an error pattern corresponding to a minimum Euclidean distance is selected as the information bit error pattern.

In some other examples of the present disclosure, the information bit error pattern can be determined by the following steps: for each error pattern in the first set S1, flipping the hard-decision information sequence $a_1^K$ based on the error pattern to obtain a first flipped decoding sequence; encoding the first flipped decoding sequence to obtain an encoded flipped decoding sequence; calculating a Euclidean distance between the encoded flipped decoding sequence and the second codeword $v_1^N$; and determining an error pattern $e_1$ with a minimum Euclidean distance as the information bit error pattern. In these examples, the first flipped decoding sequence would be encoded by the systematic generator matrix $G_1$ to obtain the encoded flipped decoding sequence.

In step S303, a codeword error pattern is determined from the second set according to the hard-decision codeword and the second codeword.

In some examples of the present disclosure, the codeword error pattern can be determined by the following steps: for each error pattern in the second set S2, flipping the hard-decision codeword $a_1^N$ based on the error pattern to obtain a second flipped decoding sequence; calculating a Euclidean distance between the second flipped decoding sequence and the second codeword $v_1^N$; and determining an error pattern $e_2$ with a minimum Euclidean distance as the codeword error pattern.

After the information bit error pattern and the codeword error pattern are selected, the first set and the second set would be extended. Specifically, the method of extending the first set and the second set would be described as the following steps.

In step S304, the information bit error pattern is removed from the first set to obtain a third set, and the codeword error pattern is removed from the second set to obtain a fourth set.

In this step, the information bit error pattern $e_1$ is removed from the first set S1 to obtain the third set S3; and the codeword error pattern $e_2$ is removed from the second set S2 to obtain the fourth set S4.

In step S305, the third set and the fourth set are extended respectively to add possible error patterns in the third set and the fourth set.

The specific process of extending the third set S3 is as follows.

In response to determining that the information bit error pattern $e_1$ is the all-zero sequence, the maximum storage quantity is updated as L1=L1+1, and a value of a bit with a maximum bit index (that is, the rightmost bit) is modified from 0 to 1 to obtain a modified error pattern as a possible error pattern. Then, the modified error pattern is added to the third set S3. In this case, the extension of the third set S3 completes. After that, the following post-processing operation may be performed.

In response to determining that the information bit error pattern $e_1$ is not the all-zero sequence, a target bit with a value being 1 and a minimum bit index (that is, the leftmost bit) in the information bit error pattern $e_1$ is searched for. In this example, the bit index of the target bit is denoted as j1.

In response to determining that the bit index of the target bit j1 is 1, the extension of the third set S3 completes. After that, the following post-processing operation may be performed.

In response to determining that the bit index of the target bit j1 is not 1, the maximum storage quantity is updated as L1=L1+2, and a value of a previous bit (a bit with the bit index of j1−1) of the target bit would be modified from 0 to 1 to obtain a first modified error pattern. Further, based on the first modified error pattern, the value of the target bit would be modified from 1 to 0 to obtain a second modified error pattern. Then, the first modified error pattern and the second modified error pattern are added to the third set S3. In this case, the extension of the third set S3 completes. After that, the following post-processing operation may be performed.

The specific process of extending the fourth set S4 is as follows.

In response to determining that the codeword error pattern $e_2$ is the all-zero sequence, the maximum storage quantity is updated as L2=L2+1, and a value of a bit with a maximum bit index (that is, the rightmost bit) is modified from 0 to 1 to obtain a modified error pattern as a possible error pattern. Then, the modified error pattern is added to the fourth set S4. In this case, the extension of the fourth set S4 completes. After that, the following post-processing operation may be performed.

In response to determining that the codeword error pattern $e_2$ is not the all-zero sequence, a target bit with a value being 1 and a minimum bit index (that is, the leftmost bit) in the codeword error pattern $e_2$ is searched for. The bit index of the target bit is denoted as j2.

In response to determining that the bit index of the target bit j2 is 1, the extension of the fourth set S4 completes. After that, the following post-processing operation may be performed.

In response to determining that the bit index of the target bit j2 is not 1, the maximum storage quantity is updated as L2=L2+2, and a value of a previous bit (a bit with the bit index of j2−1) of the target bit would be modified from 0 to 1 to obtain a third modified error pattern. Further, based on the third modified error pattern, the value of the target bit would be modified from 1 to 0 to obtain a fourth modified error pattern. Then, the third modified error pattern and the fourth modified error pattern are added to the fourth set S4. In this case, the extension of the fourth set S4 completes. After that, the following post-processing operation may be performed.

In step S306, the extended third set is taken as the first set and the extended fourth set is taken as the second set.

The following post-processing operation may be performed after the extensions of the sets are completed. Moreover, after the post-processing process is completed, the step of determining an error pattern according to the hard-decision information sequence and the hard-decision codeword may be performed again until the maximum number of iteration times is reached, and thus the decoding ends.

Figure 4:
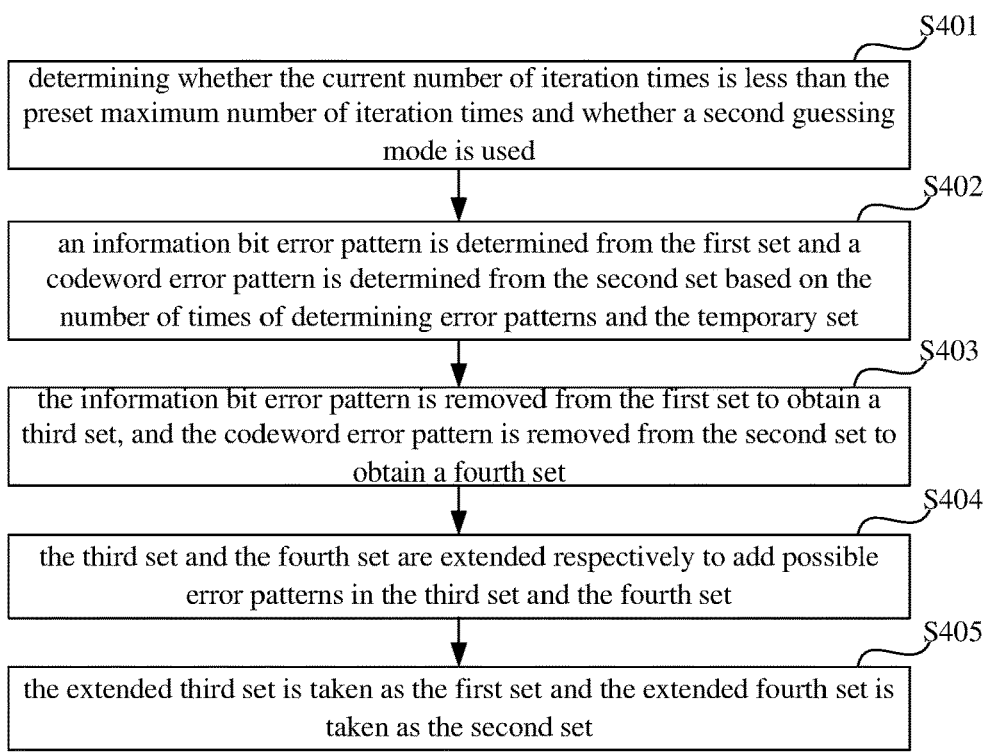
FIG. 4 is a flowchart of determining an error pattern through a second guessing mode according to some examples of the present disclosure.

FIG. 4 is a flowchart of determining the error patterns through a second guessing mode according to some examples of the present disclosure.

In step S401, determining whether the current number of iteration times is less than the preset maximum number of iteration times and whether a second guessing mode is used.

In some examples of the present disclosure, the first set S1, the second set S2, the maximum storage quantity L1 of the first set S1 and the maximum storage quantity L2 of the second set S2 would be initialized at first. Specifically, in this example, the maximum storage quantity L1 of the first set S1 can be set as 1, the maximum storage quantity L2 of the second set S2 can be set as 0, and the error pattern in the first set S1 can be initialized as an all-zero sequence.

Moreover, in some examples of the present disclosure, a temporary set S is defined and preset as a null set. Further, a number of times of determining error patterns is also defined. In some examples, the number of times of determining error patterns can be initialized as 0.

In the above step, it is determined whether the current number of iteration times Query_times is less than the preset maximum number of iteration times b, and whether the second guessing mode is used at the same time. In response to determining that the current number of iteration times is less than the preset maximum number of iteration times and the second guessing mode is used, proceed to step S402. Moreover, in response to determining that the current number of iteration times is larger than or equals to the preset maximum number of iteration times, the decoding process would be terminated.

In step S402, an information bit error pattern is determined from the first set and a codeword error pattern is determined from the second set based on the number of times of determining error patterns and the temporary set.

Figure 5:
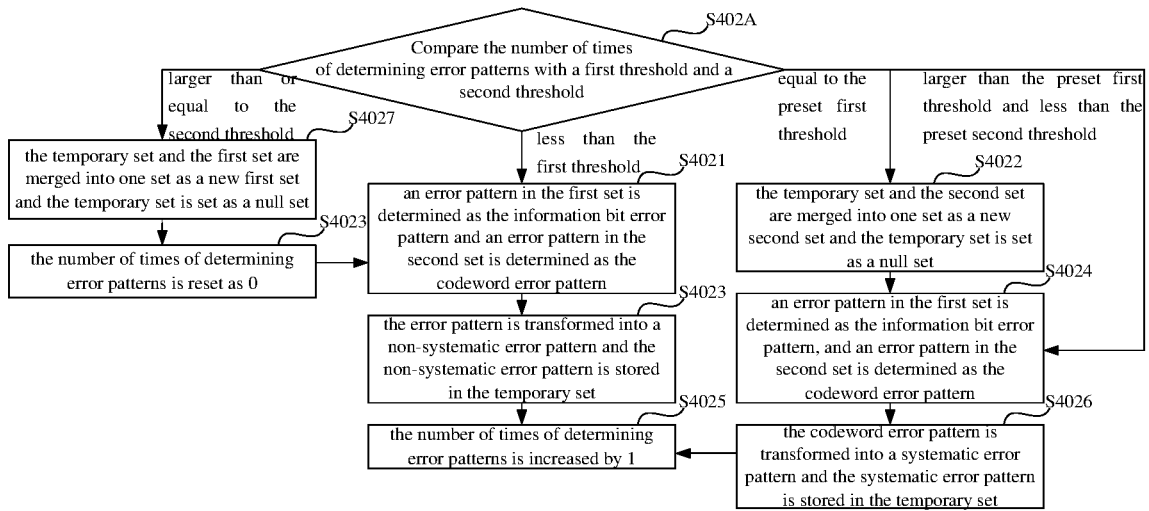
FIG. 5 is a flowchart of determining an error pattern through a second guessing mode according to some other examples of the present disclosure.

FIG. 5 is a flowchart illustrating a detailed process of determining the information bit error pattern and determining the codeword error pattern. As shown in FIG. 5, the detailed process of determining the information bit error pattern and determining the codeword error pattern may include the following steps.

In step S402A, compare the number of times of determining error patterns with a first threshold and a second threshold.

In response to determining the number of times of determining error patterns is less than the first threshold, proceed to S4021.

In response to determining the number of times of determining error patterns equals to the preset first threshold, proceed to S4022.

In response to determining the number of times of determining error patterns is larger than the preset first threshold and is less than the preset second threshold, proceed to S4024.

In response to determining the number of times of determining error patterns is larger than or equals to the second threshold, proceed to S4027.

In some examples of the present disclosure, the second threshold refers to a maximum value of the number of times of determining error patterns. Moreover, the first threshold can be set as a half of the second threshold. For example, the second threshold may be set as 100. In this case, the first threshold may be set as 50.

In step S4021, an error pattern $e_1$ in the first set S1 is determined as the information bit error pattern and an error pattern $e_2$ in the second set S2 is determined as the codeword error pattern. Then, proceed to step S4023.

To be noted, the specific method of determining the information bit error pattern can refer to step S302 and the specific method of determining the codeword error pattern can refer to step S303, which will not be elaborated herein.

It should be noted that since the maximum error pattern storage quantity L2 in the second set S2 is initialized as 0, the codeword error pattern $e_2$ determined for the first time would be 0.

In step S4023, the error pattern $e_1$ is transformed into a non-systematic error pattern $e_2$ and the non-systematic error pattern $e_2$ is stored in the temporary set S. Then, proceed to step S4025.

In this step, the information bit error pattern $e_1$ obtained in step S4021 would be transformed into a non-systematic error pattern, and as stated above the codeword error pattern $e_2$ determined for the first time in step S4021 is 0, the transformed non-systematic codeword error pattern may be denoted as $e_2$, and can be stored in the temporary set S which is initially set as a null set.

In step S4025, the number of times of determining error patterns is increased by 1.

That is, assuming that the number of times of determining error patterns is denoted as Number, in step S4025, let Number=Number+1.

After step S4025 is performed, the information bit error pattern $e_1$ would be removed from the first set S1 to obtain a third set S3; and the codeword error pattern $e_2$ would be removed from the second set S2 to obtain a fourth set S4. Then, the third set and the fourth set would be extended respectively to add possible error patterns in the third set and the fourth set. Finally, the extended third set would be taken as the first set and the extended fourth set would be taken as the second set. To be noted, the specific process of extending the third set and the fourth set is the same with the process of step S305, which will not be elaborated herein.

Then the following post-processing operation may be performed after the extensions of the first set and the second set are completed. Moreover, after the post-processing process is completed, the step of determining an error pattern according to the hard-decision information sequence and the hard-decision codeword may be performed until the maximum number of iteration times is reached, and the decoding ends.

In step S4022, the temporary set S and the second set S2 are merged into one set as a new second set S2 and the temporary set S is set as a null set again. Then, proceed to step S4024.

In this step, the non-systematic error pattern $e_2$ stored in the temporary set S in step S4023 would be added into the second set S2, that is, let $S_2=S_2 \cup S$. After that, the temporary set S would be reset as a null set.

In step S4024, an error pattern $e_1$ in the first set S1 is determined as the information bit error pattern, and an error pattern $e_2$ in the second set S2 is determined as the codeword error pattern. Then, proceed to step S4026.

To be noted, the specific method of determining the information bit error pattern can refer to step S302 and the specific method of determining the codeword error pattern can refer to step S303 which will not be elaborated herein.

In step S4026, the codeword error pattern $e_2$ is transformed into a systematic error pattern $e_1$ and the systematic error pattern $e_1$ is stored in the temporary set S.

In this step, the codeword error pattern $e_2$ obtained in step S4024 would be transformed into a systematic error pattern $e_1$, and the transformed systematic error pattern $e_1$ may be stored in the temporary set S.

After step S4026, step S4025 would be performed.

In step S4027, the temporary set S and the first set S1 would be merged into one set as a new first set S1 and the temporary set S would be set as a null set again. Then, proceed to step S4028.

In this step, the systematic error patterns $e_1$ stored in the temporary set S would be added into the first set S1, that is, let $S_1=S_1 \cup S$. After that, the temporary set S would be reset as a null set again.

In step S4028, the number of times of determining error patterns is reset as 0. That is, let Number=0.

After step S4028, step S4021 would be performed.

In step S403, the information bit error pattern is removed from the first set to obtain a third set, and the codeword error pattern is removed from the second set to obtain a fourth set.

In step S404, the third set and the fourth set are extended respectively to add possible error patterns in the third set and the fourth set.

In step S405, the extended third set is taken as the first set and the extended fourth set is taken as the second set.

To be noted, the above steps S403-S405 are the same with steps S304-S306. Therefore, details of steps S403-S405 will not be elaborated herein.

It can be seen that the process would be repeated until the maximum number of iteration times is reached and the decoding ends.

Figure 6:
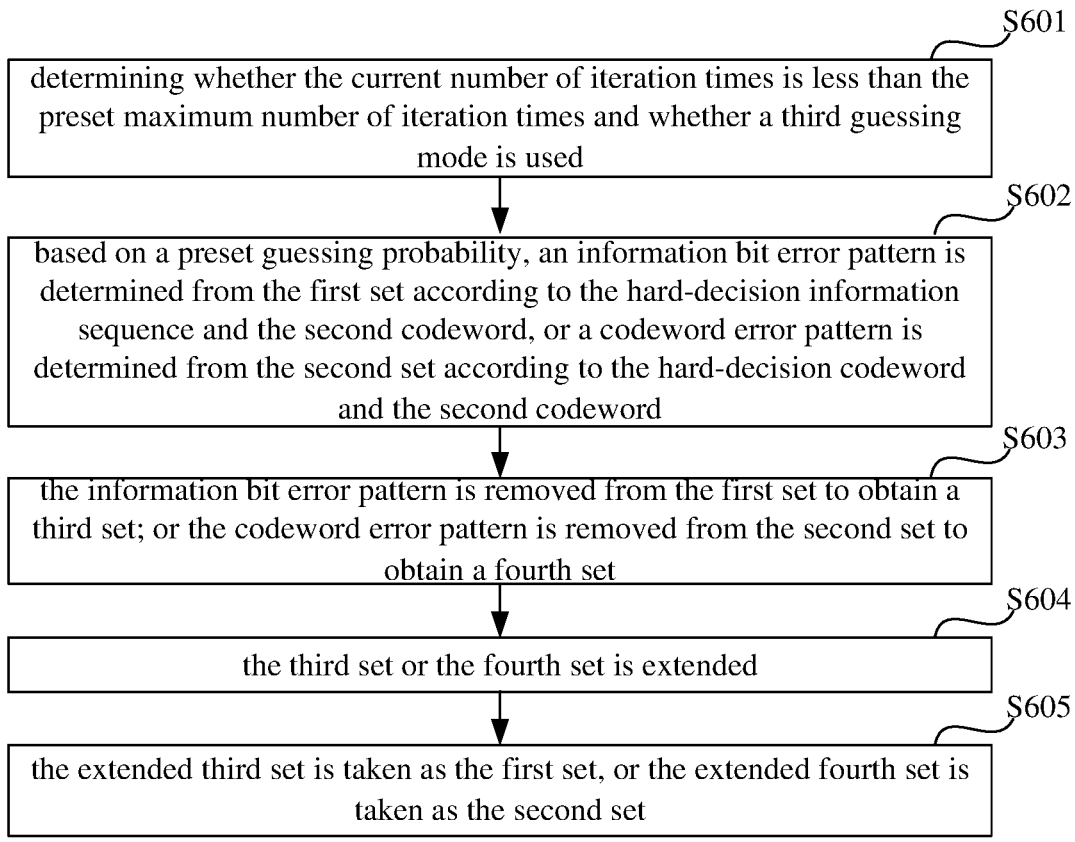
FIG. 6 is a flowchart of determining an error pattern through a third guessing mode according to some examples of the present disclosure.

FIG. 6 is a flowchart of determining an error pattern through a third guessing mode according to some examples of the present disclosure.

In step S601, determining whether the current number of iteration times is less than the preset maximum number of iteration times and whether a third guessing mode is used.

In some examples of the present disclosure, the first set S1, the second set S2, the maximum storage quantity L1 of the first set S1 and the maximum storage quantity L2 of the second set S2 would be initialized at first. Specifically, the maximum storage quantity L1 of the first set S1 can be set as 1, the maximum storage quantity L2 of the second set S2 can be set as 1 too, and the error patterns in the first set S1 and the second set S2 can be both initialized as all-zero sequences.

In the above step, it is determined whether the current number of iteration times Query_times is less than the preset maximum number of iteration times b, and whether the third guessing mode is used at the same time. In response to determining that the current number of iteration times is less than the preset maximum number of iteration times and the third guessing mode is used, proceed to step S602. Moreover, in response to determining that the current number of iteration times is larger than or equals to the preset maximum number of iteration times, the decoding process would be terminated.

In step S602, based on a preset guessing probability, an information bit error pattern is determined from the first set according to the hard-decision information sequence and the second codeword, or a codeword error pattern is determined from the second set according to the hard-decision codeword and the second codeword.

In this example, a guessing probability is defined and preset to determine whether to determine the information bit error pattern or to determine the codeword error pattern.

In some examples, a threshold of the guessing probability may be set as 0.1. That is, if the guessing probability is less than 0.1, the codeword error pattern may be determined. Or if the guessing probability is greater than or equals to 0.1, the information bit error pattern may be determined.

To be noted, the specific method of determining the information bit error pattern can refer to step S302 and the specific method of determining the codeword error pattern can refer to step S303 which will not be elaborated herein.

In step S603, the information bit error pattern is removed from the first set to obtain a third set; or the codeword error pattern is removed from the second set to obtain a fourth set.

Specifically, in step S603, the information bit error pattern $e_1$ would be removed from the first set S1 to obtain the third set S3. Or, the codeword error pattern $e_2$ would be removed from the second set S2 to obtain the fourth set S4.

In step S604, the third set or the fourth set is extended.

In this step, the third set or the fourth set would be extended respectively to add possible error patterns in the third set or the fourth set. To be noted, the specific process of extending the third set or extending the fourth set is the same with the process of step S305, which will not be elaborated herein.

In step S605, the extended third set is taken as the first set, or the extended fourth set is taken as the second set.

The following post-processing operation may be performed after the extension of the first set or the second set is completed. Moreover, after the post-processing process is completed, the step of determining an error pattern according to the hard-decision information sequence or the hard-decision codeword may be performed until the maximum number of iteration times is reached, and the decoding ends.

It should be noted that whether to use the first guessing mode, the second guessing mode or the third guessing mode can be selected by a user.

As stated above, in the process of determining an information bit error pattern from the first set, the core is to find an error pattern $e_1$ which can minimize the Euclidean distance $\|v_1^K-(1_K-2(a_1^K \oplus (e\_inf_1^K)))\|^2$ between the sequence after flipping and the first K bits $v_1^K$ of the second codeword $v_1^N$, and to extend the first set S1. In the process of determining the codeword error pattern from the second set, the core is to find an error pattern $e_2$ which can minimize the Euclidean distance $\|v_1^N-(1_N-2(a_1^N \oplus (e\_code_1^N)))\|^2$ between the sequence after flipping and the second codeword $v_1^N$, and to extend the second set S2. These two steps can make the JGEPD decoding algorithm find a correct error pattern as soon as possible. In this way, a correct sequence would be found quickly. Thus, the efficiency of the decoding process would be improved and the performance of the decoding process can be guaranteed with a low decoding complexity.

In step S103, the error pattern is post-processed and an optimal decoding sequence is output as a decoding result, where the optimal decoding sequence is a decoding sequence with a minimized Euclidean distance.

Through the above steps S101 and S102, the JGEPD decoding algorithm may obtain a hard-decision information sequence, a hard-decision codeword and one or more error patterns. Therefore, a step of bit flipping on the hard-decision information sequence and the hard-decision codeword are required in the post-processing process. In this way, a new decoding sequence can be regenerated, and the new decoding sequence should be subjected to a check relation or a constraint relation.

In some examples of the present disclosure, a hard-decision information sequence after flipping can be denoted as $\hat{c}\_inf_1^k$. A codeword can be obtained according to the systematic generator matrix $G_1$ and the and hard-decision information sequence after flipping. The codeword can be denoted as a first bit sequence $\hat{c}\_inf_1^N$. Further, a first sequence obtained by modulating the first bit sequence can be denoted as $m\_inf_1^N$. Moreover, a Euclidean distance between the first sequence and the second codeword can be calculated as a first Euclidean distance $d(m\_inf_1^N, v_1^N)$.

Further, in the above step, a hard-decision codeword after flipping can be denoted as a second bit sequence $\hat{c}\_code_1^N$. A sequence obtained by modulating the second bit sequence can be denoted as $m\_code_1^N$. Moreover, a Euclidean distance between the second sequence and the second codeword can be calculated as a second Euclidean distance $d(m\_code_1^N, v_1^N)$.

Moreover, a minimal Euclidean distance in the post-processing process is denoted as $d_{min}(m_1^N, v_1^N)$, which is suitable for both the hard-decision information sequence and the hard-decision codeword.

To be noted, the specific method of the post-processing process on the information bit error pattern and the specific method of the post-processing process on the codeword error pattern are the same. In examples of the present disclosure, the information bit error pattern and codeword error pattern can be called as the error pattern.

Figure 7:
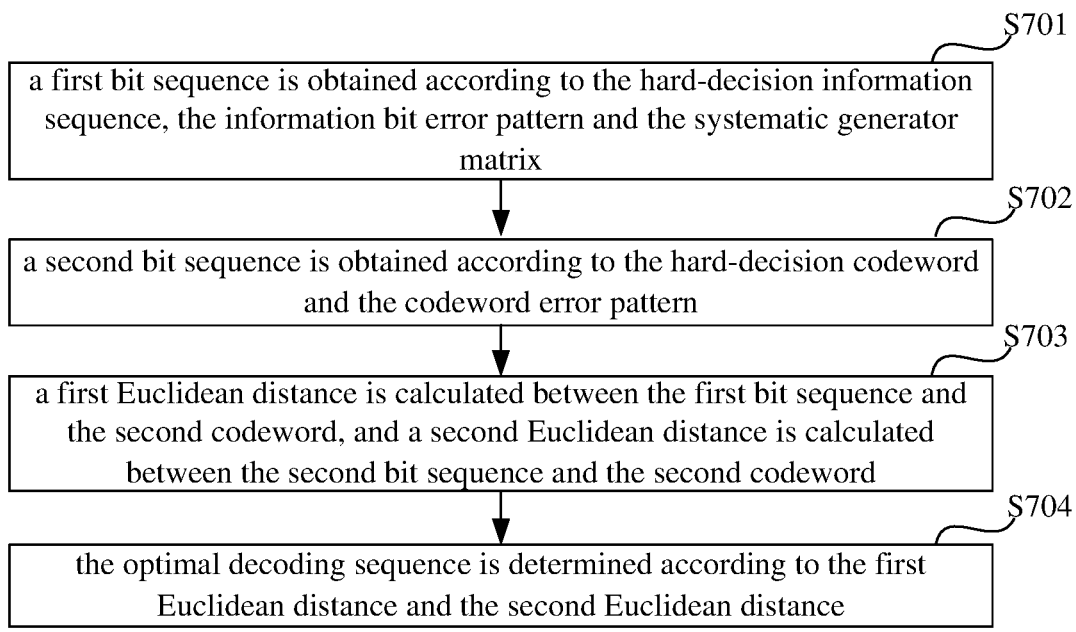
FIG. 7 is a flowchart of post-processing the error pattern and outputting an optimal decoding sequence as a decoding result according to some examples of the present disclosure.
Figure 8:
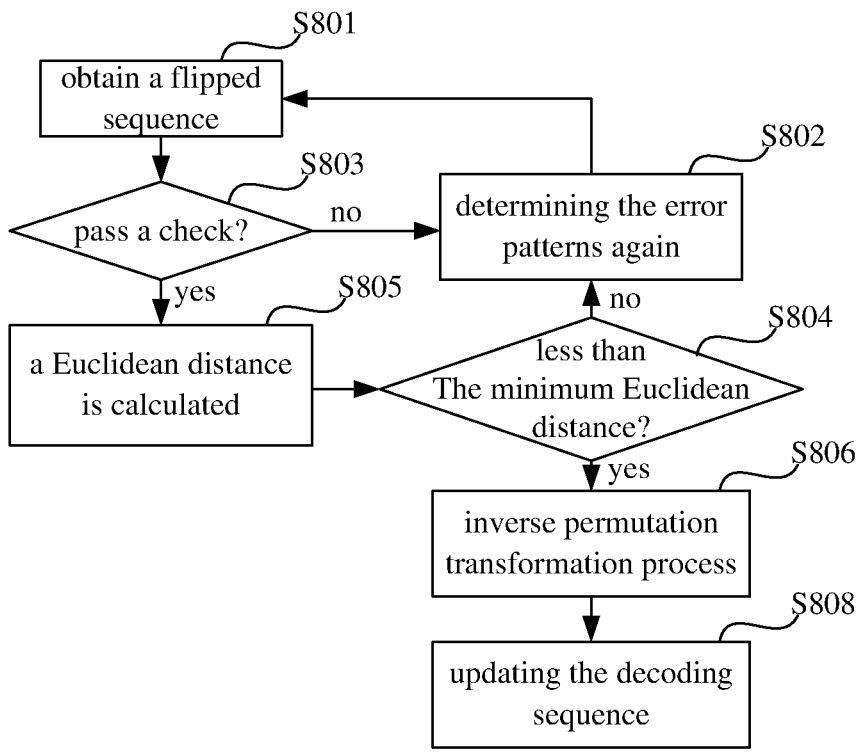
FIG. 8 is a flowchart of post-processing the error pattern and outputting an optimal decoding sequence as a decoding result according to some examples of the present disclosure.

FIG. 7 is a flowchart illustrating a post-processing process on an error pattern according to examples of the present disclosure. FIG. 8 is another flowchart illustrating a post-processing process on an error pattern according to examples of the present disclosure. In FIG. 7 and FIG. 8, the error patterns are determined through the first guessing mode or the second guessing mode. As shown in FIG. 7 and FIG. 8, the post-processing process may include the following steps.

In step S701, a first bit sequence is obtained according to the hard-decision information sequence, the information bit error pattern and the systematic generator matrix.

In step S702, a second bit sequence is obtained according to the hard-decision codeword and the codeword error pattern.

Also as shown in step S801 of FIG. 8, the hard-decision information sequence $a_1^K$ is flipped according to the information bit error pattern $e_1$ obtained in the above process to obtain a sequence $\hat{c}\_inf_1^K = a_1^K \oplus e_1$, and a re-encoding is performed according to the systematic generator matrix $G_1$ to obtain the first bit sequence $\hat{c}\_inf_1^N$.

Further, as shown in step S801 of FIG. 8, the hard-decision codeword $a_1^N$ is flipped according to the codeword error pattern $e_2$ obtained in the above process to obtain the second bit sequence $\hat{c}\_code_1^N = a_1^N \oplus e_2$.

In step S703, a first Euclidean distance is calculated between the first bit sequence and the second codeword, and a second Euclidean distance is calculated between the second bit sequence and the second codeword.

To be noted, before calculating the first Euclidean distance and the second Euclidean distance, a check should be performed on the first bit sequence and the second bit sequence first. And only in response to determining that the first bit sequence and the second bit sequence pass the check, the first Euclidean distance and the second Euclidean distance would be calculated.

In examples of the present disclosure, the check refers to checking whether the first bit sequence and the second bit sequence satisfy a check relation or a constraint relation predefined. To be noted, for different source encoding, the check relations are different. For example, for CRC concatenated polar codes, the check may include a frozen bit check and a check on the constraint relation of CRC; and for other linear block codes, a check may be performed by multiplying the decoding sequence by a check matrix and checking whether a result is 0.

As shown in FIG. 8, if the check is passed, the first bit sequence and the second bit sequence are first modulated to obtain a first sequence $m\_inf_1^N$ and a second sequence $m\_code_1^N$ in step S803; and the first Euclidean distance $d(m\_inf_1^N, v_1^N)$ and the second Euclidean distance $d(m\_code_1^N, v_1^N)$ are calculated in step S805. While on the other hand, if the check cannot be passed, the step of determining the error patterns may be performed again to determine new error patterns, as shown in step S802.

In step S704, the optimal decoding sequence is determined according to the first Euclidean distance and the second Euclidean distance.

As shown in step S804 of FIG. 8, the first Euclidean distance $d(m\_inf_1^N, v_1^N)$ and the second Euclidean distance $d(m\_code_1^N, v_1^N)$ are compared with the minimum Euclidean distance $d_{min}(m_1^N, v_1^N)$ respectively. If $d(m\_inf_1^N, v_1^N) < d_{min}(m_1^N, v_1^N)$, the first bit sequence $\hat{c}\_inf_1^N$ is subjected to an inverse permutation transformation; and if $d(m\_code_1^N, v_1^N) < d_{min}(m_1^N, v_1^N)$, the second bit sequence $\hat{c}\_code_1^N$ is subjected to an inverse permutation transformation.

Specifically, since the error patterns are determined at almost the same time, during the comparisons with the minimum Euclidean distance, the distance less than the minimum Euclidean distance should be found from the first Euclidean distance and the second Euclidean distance. For example, assuming that the first Euclidean distance is determined first, and the determination result is that the first Euclidean distance is less than the minimum Euclidean distance, then the first Euclidean distance should be taken as an updated minimum Euclidean distance. Further, the first Euclidean distance and the second Euclidean distance are compared. Assuming that the determination result is that the second Euclidean distance is less than the first Euclidean distance, then the second Euclidean distance should be taken as an updated minimum Euclidean distance. In this case, the second bit sequence corresponding to the second Euclidean distance should be subjected to an inverse permutation transformation.

Taking the first bit sequence as an example, the inverse permutation transformation process in S806 is explained as follows:

Firstly, the bit with the bit index j2i in the first bit sequence $\hat{c}\_inf_1^N$ is transformed into a position with the bit index j1i in a new sequence. Then, the bit with the bit index j1i in the new sequence is transformed into the position with the bit index i in a decoding sequence to obtain the decoding sequence $de_1^N$. It can be seen the inverse permutation transformation process can be regarded as an inverse process of the first permutation transformation processing and the second permutation transformation processing.

Taking the second bit sequence as an example, the inverse permutation transformation process in S806 is explained as follows:

Firstly, the bit with the bit index j2i in the second bit sequence $\hat{c}\_code_1^N$ is transformed into a position with the bit index j1i in a new sequence, then the bit with the number j1i in the new sequence is transformed into the position with the bit index i in a decoding sequence to obtain the decoding sequence $de_1^N$. In this example, it can also be seen the inverse permutation transformation process can be regarded as an inverse process of the first permutation transformation processing and the second permutation transformation processing.

It should be noted that since the final output result is unique during comparison with the minimum Euclidean distance, the decoding sequence obtained after inverse permutation transformation is not distinguished again, which is denoted as $de_1^N$.

The decoding sequence obtained in a first iteration should be retained. Later, if a smaller Euclidean distance is obtained in a next iteration, the decoding sequence may be updated. That is, in each iteration process, if a smaller Euclidean distance is obtained, step S808 is performed. That is, the decoding sequence retained is updated as the decoding sequence obtained in the current iteration. Otherwise, the decoding sequence obtained in the current iteration may be discarded. In this way, the decoding sequence retained can be regarded as an optimal decoding sequence and can be output as the decoding result when the maximum number of iteration times is reached.

Figure 9:
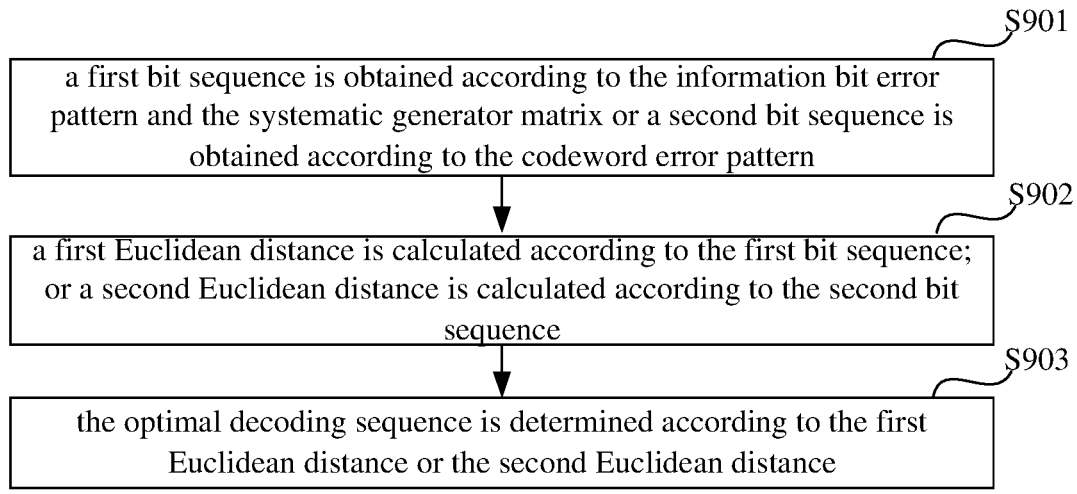
FIG. 9 is a flowchart of post-processing the error pattern and outputting an optimal decoding sequence as a decoding result according to some other examples of the present disclosure.

FIG. 9 is a flowchart of post-processing the error patterns and outputting an optimal decoding sequence as a decoding result according to an example of the present disclosure. In FIG. 9, the error patterns are determined through the third guessing mode.

In step S901, a first bit sequence is obtained according to the information bit error pattern and the systematic generator matrix or a second bit sequence is obtained according to the codeword error pattern.

The specific process of obtaining the first bit sequence or the second bit sequence is the same as the above, which will not be elaborated herein.

In step S902, a first Euclidean distance is calculated according to the first bit sequence; or a second Euclidean distance is calculated according to the second bit sequence.

As stated above, before calculating the Euclidean distance, a check on the first bit sequence or on the second bit sequence should be performed at first. In this case, in response to determining that the first bit sequence passes the check, a first Euclidean distance is calculated according to the first bit sequence; or in response to determining that the second bit sequence passes the check, a second Euclidean distance is calculated according to the second bit sequence.

The specific process of calculating the first Euclidean distance or the second Euclidean distance is the same as the above, which will not be elaborated herein.

In step S903, the optimal decoding sequence is determined according to the first Euclidean distance or the second Euclidean distance.

The specific process of determining the optimal decoding sequence is the same as the above, which will not be elaborated herein.

It should be noted that if error patterns are determined in parallel for the information bits and the codewords (that is, through the first guessing mode and through the second guessing mode), it is necessary to process two flipped sequences in parallel, therefore, a total number of query times in the process should be updated as: Query_times=Query_times+2. However, if the error pattern is determined in a probability manner (that is, through the third guessing mode), it is only necessary to process the corresponding bit sequence for one time, therefore, the total number of query times in the process should be updated as: Query_times=Query_times+1.

According to examples of the present disclosure, the performance of the decoding algorithm can be improved by finding the minimum Euclidean distance in the codeword that can pass the check on the check relation and the constraint relation, so that the output decoding sequence is more accurate.

The decoding method provided by the present disclosure has the following technical effects:

1) According to the present disclosure, the bit that is most likely to be an error can be found as soon as possible by performing a joint guessing on the error patterns for the information bits and the codewords. The guessing process is performed based on the minimum Euclidean distance calculated, so that the decoding algorithm can be performed in order, and the decoding complexity can be effectively reduced.
2) A maximum number of query times is set, so that the number of query times is limited, therefore a low complexity can be ensured.
3) According to the present disclosure, the decoding sequence is further determined through a check on the check relation and the constraint relation, so that the correct decoding result can be found more accurately, therefore, the decoding performance is further improved.
4) The JGEPD provided by the present disclosure is suitable for any code rate. Further, the decoding method is applicable to not only short codes, medium-length codes but also long codes.

It should be noted that the decoding method according to one or more examples of the present disclosure may be implemented by a single device, such as a computer or a server. The decoding method may also be applied to a distributed scenario and may be completed by cooperations of a plurality of devices. In a case of the distributed scenario, one of the plurality of devices may merely implement one or more steps in the decoding method, and the plurality of devices may interact with each other to complete the decoding method.

It should be noted that, specific examples of the present disclosure have been described above. Other examples are within the scope of the appended claims. In some cases, the actions or steps recited in the claims can be performed in an order different from that in the examples, and can still achieve desired results. In addition, the processes depicted in the accompanying drawings are not necessarily required to be shown in a particular or sequential order, to achieve desired results. In some implementations, multi-task processing and parallel processing are also possible or may be advantageous.

Figure 10:
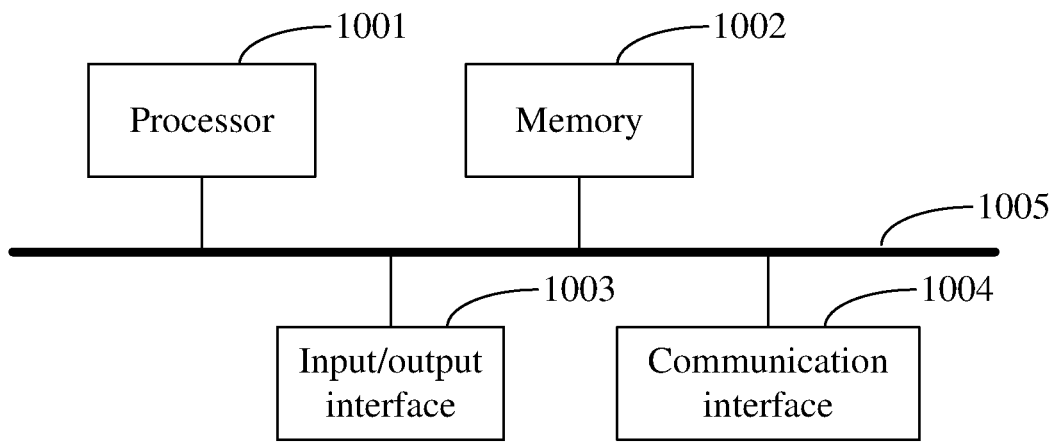
FIG. 10 is a schematic diagram illustration a structure of a decoding device according to an example of the present disclosure.

Based on the above decoding method, the present disclosure also provides an electrical device for implementing the decoding method. FIG. 10 is a schematic diagram illustrating a structure of an electrical device according to an example of the present disclosure.

As shown in FIG. 10, the electronic device may include one or more processors 1001, a memory 1002. In FIG. 6, only one processor 1001 is illustrated. The electronic device may further include an input/output interface 1003, a communication interface 1004, and a bus 1005. The processor

1001, the memory 1002, the input/output interface 1003, and the communication interface 1004 may couple to each other via the bus 1005.

To be noted, a computer program stored in the memory and executable on the processor, wherein the processor executes the program to implement the decoding method.

The processor 1001 may execute the relevant procedures by virtue of a general central processing unit (CPU), a microprocessor, an application specific integrated circuit (ASIC), or one or more integrated circuits, so as to implement the technical solution provided by the examples of the description.

The memory 1002 may be implemented by a read only memory (ROM), a random-access memory (RAM), a static memory device and a dynamic memory device, etc. The memory 1002 may store an operating system and other application procedures. When the technical solution provided by the example of the description is implemented via the software or the hardware, the related procedure codes are stored in the memory 1002 and revoked by the processor 1001.

The I/O interface 1003 is used for connecting an I/O unit to realize information input and output. The I/O unit may be configured in the device (not in the figure) as a component configuration, and may be externally connected to the device to provide the corresponding functions. The input device may include keyboard, mouse, touch screen, microphone and various sensors. The output device may include display, loudspeaker, vibrator and indicator lamp.

A communication interface 1004 is used for connecting a communication unit (not shown in the figure) to realize communication interaction between the device and other devices. The communication unit may realize communication in a wired manner (for example, USB, wire, etc.) or in a wireless manner (for example, mobile network, WIFI, Bluetooth, etc.).

The bus 1005 includes a passage which transmits information among various components (for example, the processor 1001, the memory 1002, the I/O interface 1003 and the communication interface 1004) on the device.

It should be noted that, although the above-mentioned device merely shows the processor 1001, the memory 1002, the I/O interface 1003 and the communication interface 1004 and the bus 1005, the device may further include other components required by the normal operation in the specific implementation process. Besides, those skilled in the art could appreciate that the above-mentioned device may merely include the components required by the solution in the examples of the Description, but not necessarily include all components shown in the figure.

The electronic device according to the foregoing examples is used for implementing the corresponding decoding method in any one of the foregoing examples, and has the beneficial effects of the corresponding method examples, which are not repeated in detail.

The flowcharts and block diagrams in the drawings illustrate the system architecture, functionality, and operation possibly implemented by systems, methods and computer program products according to various examples of the present invention. In this regard, each block in the flowcharts or block diagrams may represent a unit, program segment, or portion of code, which comprises one or more executable instructions for implementing the specified logical function(s). It should also be noted that, in some alternative implementations, the functions noted in the block may occur out of the order noted in the drawings. For example, two blocks shown in succession may, in fact, be executed substantially concurrently, or the blocks may sometimes be executed in the reverse order, depending upon the functionality involved. It should also be also noted that each block and combination of blocks in the flowcharts or block diagrams can be implemented by special purpose hardware-based systems which perform the specified functions or steps, or combinations of special purpose hardware and computer instructions.

The units or units involved in the examples of the present disclosure may be implemented by means of software or programmable hardware. The depicted units or units may be also arranged in the processor, and the titles of these units or units do not constitute the definition thereof in some cases.

Based on the same inventive concept, corresponding to the methods according to any one of the foregoing examples, the present disclosure further provides a non-transitory computer readable storage medium which stores a computer instruction used for enabling the computer to perform the decoding method according to any one of the examples.

The computer readable medium in the example includes volatile, non-volatile, movable and non-movable media, which can realize information storage by any method or technology. The information can be computer readable instruction, data structure, program unit or other data. The example of computer storage media includes, but not limited to phase-change memory (PRAM), static random access memory (SRAM), dynamic random access memory (DRAM), other types of random access memory (RAM), read only memory (ROM), electrically erasable programmable read-only memory (EEPROM), flash memory or other memory technologies, compact disk read only memory (CD-ROM), digital versatile disc (DVD) or other optical memories, cassette magnetic tape, tape, disk memory or other magnetic memory device or any other non-transmission media, and available for storing information accessible by the computing devices.

The computer instruction stored by the storage medium according to the foregoing examples is used for enabling the computer to perform the decoding method according to any one of the examples, and has the beneficial effects of the corresponding method examples, which are not repeated in detail.

Those of ordinary skill in the art should appreciate that the discussion on any one of the foregoing examples is merely exemplary, but is not intended to imply that the scope of the present disclosure (including the claims) is limited to these examples. Under the idea of the present disclosure, the technical features of the foregoing examples or different examples may be combined, the steps may be implemented in any order, and there are many other variations in different aspects of the examples of the present disclosure, all of which are not provided in detail for simplicity.

Besides, for the sake of simplifying description and discussion and not making the examples of the present disclosure difficult to understand, the provided drawings may show or not show the public power supply/earthing connection to an integrated circuit (IC) chip and other parts. Besides, the device may be shown in block diagram form to prevent the examples of the present disclosure from being difficult, and moreover, this considers the following facts, that is, the details of the implementations with regard to the devices in these block diagrams highly depend on the platform which will implement the examples of the present disclosure (that is, these details should be completely within the scope understood by those skilled in the art). Where specific details (e.g., circuits) are set forth in order to describe exemplary examples of the present disclosure, it should be apparent to those skilled in the art that the examples of the present disclosure can be practiced without, or with variation of, these specific details. Therefore, these descriptions shall be considered to be illustrative instead of restrictive thereto.

While the present disclosure has been described in conjunction with specific examples thereof, many alternatives, modifications and variations of such examples will be apparent to those of ordinary skill in the art in light of the foregoing description. For example, other memory architectures, such as dynamic RAM (DRAM), may use the examples discussed.

The examples of the disclosure are intended to embrace all such alternatives, modifications, and variations as to fall within the broad scope of the appended claims. Therefore, any omission, modification, equivalent replacement and improvement made within the spirits and principles of the examples of the present disclosure shall fall within the protection scope of the present disclosure.

What is claimed is:

1. A decoding method, comprising:
   processing a received sequence and a generator matrix to obtain a hard-decision information sequence and a hard-decision codeword;
   determining an error pattern according to the hard-decision information sequence and the hard-decision codeword; and
   post-processing the error pattern and outputting an optimal decoding sequence as a decoding result, wherein the optimal decoding sequence is a decoding sequence with a minimized Euclidean distance.

2. The method according to claim 1, wherein, processing a received sequence and a generator matrix to obtain a hard-decision information sequence and a hard-decision codeword comprises:
   obtaining a first codeword and a first matrix according to the received sequence and the generator matrix;
   obtaining a second codeword and a second matrix according to the first codeword and the first matrix;
   performing a Gaussian elimination on the second matrix to obtain a systematic generator matrix;
   performing a hard decision on the second codeword to obtain the hard-decision information sequence; and
   obtaining the hard-decision codeword according to the hard-decision information sequence and the systematic generator matrix.

3. The method according to claim 2, wherein,
   obtaining a first codeword and a first matrix according to the received sequence and the generator matrix comprises: performing a first permutation processing on the receiving sequence according to a reliability of each bit of the receiving sequence to obtain the first codeword; using a first permutation function to record the process of the first permutation; and performing the first permutation processing on the generator matrix according to the first permutation function to obtain the first matrix; and
   obtaining a second codeword and a second matrix according to the first codeword and the first matrix comprises: performing a second permutation processing on the first matrix to obtain the second matrix; using a second permutation function to record the process of the second permutation; and performing the second permutation processing on the first codeword using the second permutation function to obtain the second codeword.

4. The method according to claim 3, wherein,
   performing a first permutation processing on the receiving sequence according to a reliability of each bit of the receiving sequence to obtain the first codeword comprises: ranking the bits of the receiving sequence from high to low according to the reliability of each bit to obtain the first codeword; and
   performing a second permutation processing on the first matrix to obtain the second matrix comprises: selecting K independent column vectors from a first column on the left of the first matrix; wherein, K refers to a length of information bits; using the K independent column vectors as first K column vectors of the second matrix; and using remaining column vectors of the first matrix as remaining N–K column vectors of the second matrix in a left to right order.

5. The method according to claim 2, wherein,
   performing a Gaussian elimination processing on the second matrix to obtain the systematic generator matrix comprises: performing an elementary row transformation on the second matrix to performing the Gaussian elimination processing; and transforming the first K column vectors of the second matrix into an identity matrix;
   performing a hard-decision on the second codeword to obtain the hard-decision information sequence comprises: performing the hard-decision on a first K bits of the second codeword to obtain the hard-decision information sequence; wherein, K represents a length of information bits; and
   obtaining the hard-decision codeword according to the hard-decision information sequence and the systematic generator matrix comprises: re-encoding the hard-decision information sequence by the systematic generator matrix to obtain the hard-decision codeword.

6. The method according to claim 2, wherein, determining an error pattern according to the hard-decision information sequence and the hard-decision codeword comprises:
   in response to determining that a number of current iteration times is less than a preset maximum number of iteration times and a first guessing mode is used, determining an information bit error pattern from a first set according to the hard-decision information sequence and the second codeword, and determining a codeword error pattern from a second set according to the hard-decision codeword and the second codeword.

7. The method according to claim 6, wherein, determining an information bit error pattern from a first set according to the hard-decision information sequence and the second codeword comprises:
   for each error pattern in the first set, flipping the hard-decision information sequence based on the error pattern to obtain a first flipped decoding sequence; calculating a Euclidean distance between the first flipped decoding sequence and the first K bits of the second codeword; and determining an error pattern in the first set with a minimum Euclidean distance as the information bit error pattern; or
   for each error pattern in the first set, flipping the hard-decision information sequence based on the error pattern to obtain a first flipped decoding sequence; encoding the first flipped decoding sequence to obtain an encoded flipped decoding sequence; calculating a Euclidean distance between the encoded flipped decoding sequence and the second codeword; and determining an error pattern with a minimum Euclidean distance as the information bit error pattern.

8. The method according to claim 6, wherein, determining a codeword error pattern from a second set according to the hard-decision codeword and the second codeword comprises:
for each error pattern in the second set, flipping the hard-decision codeword based on the error pattern to obtain a second flipped decoding sequence; calculating a Euclidean distance between the second flipped decoding sequence and the second codeword; and determining an error pattern with a minimum Euclidean distance as the codeword error pattern.

9. The method according to claim 6, wherein determining an error pattern according to the hard-decision information sequence and the hard-decision codeword further comprises:
removing the information bit error pattern from the first set to obtain a third set;
removing the codeword error pattern from the second set to obtain a fourth set;
extending the third set and the fourth set respectively;
taking the extended third set as the first set; and
taking the extended fourth set as the second set.

10. The method according to claim 9, wherein extending the third set comprises:
in response to determining that the information bit error pattern is an all-zero sequence, modifying a value of a bit with a maximum bit index from 0 to 1 to obtain a modified error pattern as a possible error pattern and adding the modified error pattern to the third set; and
in response to determining that the information bit error pattern is not the all-zero sequence, a target bit with a value being 1 and a minimum bit index in the information bit error pattern is searched for; and in response to determining that the bit index of the target bit is not 1, modifying a value of a previous bit of the target bit from 0 to 1 to obtain a first modified error pattern; based on the first modified error pattern, modifying a value of the target bit from 1 to 0 to obtain a second modified error pattern; and adding the first modified error pattern and the second modified error pattern to the third set;
wherein extending the fourth set comprises:
in response to determining that the codeword error pattern is an all-zero sequence, modifying a value of a bit with a maximum bit index from 0 to 1 to obtain a modified error pattern as a possible error pattern and adding the modified error pattern to the fourth set; and
in response to determining that the codeword error pattern is not the all-zero sequence, a target bit with a value being 1 and a minimum bit index in the codeword error pattern is searched for; and in response to determining that the bit index of the target bit is not 1, modifying a value of a previous bit of the target bit from 0 to 1 to obtain a third modified error pattern; based on the third modified error pattern, modifying a value of the target bit from 1 to 0 to obtain a fourth modified error pattern; and adding the third modified error pattern and the fourth modified error pattern to the fourth set.

11. The method according to claim 6, wherein post-processing the error pattern and outputting an optimal decoding sequence as a decoding result comprises:
obtaining a first bit sequence according to the information bit error pattern and the systematic generator matrix;
obtaining a second bit sequence according to the codeword error pattern;
calculating a first Euclidean distance according to the first bit sequence;
calculating a second Euclidean distance according to the second bit sequence; and
determining the optimal decoding sequence according to the first Euclidean distance and the second Euclidean distance.

12. The method according to claim 2, wherein, determining an error pattern according to the hard-decision information sequence and the hard-decision codeword comprises:
in response to determining that a number of current iteration times is less than a preset maximum number of iteration times and a second guessing mode is used, determining an information bit error pattern from a first set and determining a codeword error pattern from a second set based on a number of times of determining error patterns and a temporary set.

13. The method according to claim 12, wherein, determining an information bit error pattern from a first set and determining a codeword error pattern from a second set based on a number of times of determining error patterns and a temporary set comprises:
comparing the number of times of determining error patterns with a first threshold and a second threshold,
in response to determining the number of times of determining error patterns is less than the first threshold, proceeding to step A;
in response to determining the number of times of determining error patterns equals to the preset first threshold, proceeding to step B;
in response to determining the number of times of determining error patterns is larger than the preset first threshold and is less than the preset second threshold, proceeding to step C;
in response to determining the number of times of determining error patterns is larger than or equals to the second threshold, proceeding to step D;
wherein the step A comprises, determining an error pattern in the first set as the information bit error pattern and determining an error pattern in the second set as the codeword error pattern; transforming the information bit error pattern into a non-systematic error pattern and storing the non-systematic error pattern in the temporary set; and proceeding to the step E;
wherein the step B comprises, merging the temporary set and the second set into one set as a new second set; setting the temporary set as a null set; and proceeding to the step C;
wherein the step C comprises, determining an error pattern in the first set as the information bit error pattern and determining an error pattern in the second set as the codeword error pattern; transforming the codeword error pattern into a systematic error pattern and storing the systematic error pattern in the temporary set; and proceeding to the step E;
wherein the step D comprises, merging the temporary set and the first set into one set as a new first set; setting the temporary set as a null set; resetting the number of times of determining error patterns as 0; and proceeding to the step A; and
wherein the step E comprises, increasing the number of times of determining error patterns by 1.

14. The method according to claim 13, wherein, determining an error pattern in the first set as the information bit error pattern comprises:
for each error pattern in the first set, flipping the hard-decision information sequence based on the error pattern to obtain a first flipped decoding sequence; calculating a Euclidean distance between the first flipped decoding sequence and the first K bits of the second codeword; and determining an error pattern in the first set with a minimum Euclidean distance as the information bit error pattern; or for each error pattern in the first set, flipping the hard-decision information sequence based on the error pattern to obtain a first flipped decoding sequence; encoding the first flipped decoding sequence to obtain an encoded flipped decoding sequence; calculating a Euclidean distance between the encoded flipped decoding sequence and the second codeword; and determining an error pattern with a minimum Euclidean distance as the information bit error pattern.

15. The method according to claim 13, wherein, determining an error pattern in the second set as the codeword error pattern comprises:

for each error pattern in the second set, flipping the hard-decision codeword based on the error pattern to obtain a second flipped decoding sequence; calculating a Euclidean distance between the second flipped decoding sequence and the second codeword; and determining an error pattern with a minimum Euclidean distance as the codeword error pattern.

16. The method according to claim 12, wherein determining an information bit error pattern from a first set and determining a codeword error pattern from a second set based on a number of times of determining error patterns and a temporary set further comprises:

removing the information bit error pattern from the first set to obtain a third set;
removing the codeword error pattern from the second set to obtain a fourth set;
extending the third set and the fourth set respectively;
taking the extended third set as the first set; and
taking the extended fourth set as the second set.

17. The method according to claim 2, wherein determining an error pattern according to the hard-decision information sequence and the hard-decision codeword comprises:

in response to determining that a number of current iteration times is less than a preset maximum number of iteration times and a third guessing mode is used, based on a preset guessing probability, determining an information bit error pattern from a first set according to the hard-decision information sequence and the second codeword, or determining a codeword error pattern from a second set according to the hard-decision codeword and the second codeword.

18. The method according to claim 17, wherein the post-processing the error pattern and outputting an optimal decoding sequence as a decoding result comprises:

obtaining a first bit sequence according to the information bit error pattern and the systematic generator matrix, and calculating a first Euclidean distance according to the first bit sequence; or obtaining a second bit sequence according to the codeword error pattern, and calculating a second Euclidean distance according to the second bit sequence; and
determining the optimal decoding sequence according to the first Euclidean distance or the second Euclidean distance.

19. An electronic device, comprising a memory, a processor, and a computer program stored in the memory and executable on the processor, wherein the processor executes the computer program to implement the decoding method of claim 1.

20. A non-transitory computer-readable storage medium, wherein the non-transitory computer-readable storage medium stores computer instructions, and the computer instructions are used to make a computer execute the decoding method of claim 1.

* * * * *